(12) United States Patent
Yamada

(10) Patent No.: US 8,415,241 B2
(45) Date of Patent: Apr. 9, 2013

(54) METHOD OF MANUFACTURING SILICON CARBIDE SEMICONDUCTOR DEVICE

(75) Inventor: Shunsuke Yamada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/349,293

(22) Filed: Jan. 12, 2012

(65) Prior Publication Data

US 2012/0184094 A1     Jul. 19, 2012

Related U.S. Application Data

(60) Provisional application No. 61/432,416, filed on Jan. 13, 2011.

(30) Foreign Application Priority Data

Jan. 13, 2011    (JP) ................................. 2011-004576

(51) Int. Cl.
*H01L 21/3205*     (2006.01)
*H01L 21/4763*     (2006.01)

(52) U.S. Cl.
USPC ... 438/586; 257/77; 257/E21.054; 257/E21065; 257/E33.066; 438/22; 438/602; 438/660; 438/931

(58) Field of Classification Search ........... 257/77, 257/E21.054, E21.065, E33.066; 438/22, 438/586, 602, 660, 931
See application file for complete search history.

(56) References Cited

U.S. PATENT DOCUMENTS

| | | | | |
|---|---|---|---|---|
| 4,990,994 | A | * | 2/1991 | Furukawa et al. ............ 257/763 |
| 5,124,779 | A | * | 6/1992 | Furukawa et al. .............. 257/77 |
| 5,323,022 | A | * | 6/1994 | Glass et al. ..................... 257/77 |
| 5,409,859 | A | * | 4/1995 | Glass et al. ................... 438/523 |
| 6,544,674 | B2 | * | 4/2003 | Tuller et al. .................. 428/698 |
| 6,653,659 | B2 | * | 11/2003 | Ryu et al. ........................ 257/77 |
| 6,833,562 | B2 | * | 12/2004 | Tanimoto et al. ............... 257/77 |
| 7,879,705 | B2 | * | 2/2011 | Kawahashi et al. ........... 438/571 |
| 2004/0183080 | A1 | * | 9/2004 | Kusumoto et al. .............. 257/77 |
| 2006/0267022 | A1 | * | 11/2006 | Mizukami et al. .............. 257/77 |
| 2009/0321746 | A1 | * | 12/2009 | Harada et al. ................... 257/77 |
| 2010/0055858 | A1 | * | 3/2010 | Hayashi et al. ............... 438/285 |
| 2010/0102332 | A1 | * | 4/2010 | Takahashi et al. ............... 257/77 |
| 2010/0248445 | A1 | * | 9/2010 | Takayama ..................... 438/458 |
| 2010/0295060 | A1 | * | 11/2010 | Kudou et al. ................... 257/77 |

(Continued)

FOREIGN PATENT DOCUMENTS

| | | |
|---|---|---|
| JP | 2000-091267 A | 3/2000 |
| JP | 2003-086534 A | 3/2003 |

(Continued)

*Primary Examiner* — Asok K Sarkar
(74) *Attorney, Agent, or Firm* — Venable LLP; Michael A. Sartori

(57) ABSTRACT

A silicon carbide substrate having a substrate surface is prepared. An insulating film is formed to cover a part of the substrate surface. A contact electrode is formed on the substrate surface, so as to be in contact with the insulating film. The contact electrode contains Al, Ti, and Si atoms. The contact electrode includes an alloy film made of an alloy containing Al atoms and at least any of Si atoms and Ti atoms. The contact electrode is annealed such that the silicon carbide substrate and the contact electrode establish ohmic connection with each other. Thus, in a case where a contact electrode having Al atoms is employed, insulation reliability of the insulating film can be improved.

7 Claims, 12 Drawing Sheets

U.S. PATENT DOCUMENTS

| | | |
|---|---|---|
| 2011/0031507 A1 | 2/2011 | Tamaso |
| 2011/0227096 A1* | 9/2011 | Wada et al. .................. 257/77 |
| 2011/0266558 A1* | 11/2011 | Yano ............................. 257/77 |
| 2011/0284876 A1* | 11/2011 | Okamura et al. ............. 257/77 |
| 2011/0287626 A1* | 11/2011 | Seki et al. ................... 438/602 |
| 2012/0007104 A1 | 1/2012 | Wada et al. |

FOREIGN PATENT DOCUMENTS

| | | |
|---|---|---|
| WO | WO-2009/128382 A1 | 10/2009 |
| WO | WO2009/128419 | 10/2009 |
| WO | WO-2010/134415 A1 | 11/2010 |

* cited by examiner

METHOD OF MANUFACTURING SILICON CARBIDE SEMICONDUCTOR DEVICE

BACKGROUND OF THE INVENTION

1. Field of the Invention

The present invention relates to a method of manufacturing a silicon carbide semiconductor device, and more particularly to a method of manufacturing a silicon carbide semiconductor device having a contact electrode containing Al atoms.

2. Description of the Background Art

WO2009/128419 (Patent Literature 1) discloses a material containing titanium (Ti) and aluminum (Al) as a material for an ohmic contact electrode arranged in contact with an SiC wafer (a silicon carbide substrate). According to this publication, a contact resistance with the SiC wafer can be lowered by applying the material above.

In a case where a contact electrode having Al atoms is arranged in contact with an insulating film, Al atoms in the contact electrode may diffuse into the insulating film during annealing treatment, which may result in lowering in insulation reliability of the insulating film. Then, an object of the present invention is to provide a method of manufacturing a silicon carbide semiconductor device capable of improving insulation reliability of an insulating film in a case where a contact electrode having Al atoms is employed.

SUMMARY OF THE INVENTION

A method of manufacturing a silicon carbide semiconductor device according to the present invention includes the following steps.

A silicon carbide substrate having a substrate surface is prepared. An insulating film is formed to cover a part of the substrate surface. A contact electrode is formed on the substrate surface, so as to be in contact with the insulating film. The contact electrode contains Al, Ti, and Si atoms. The contact electrode includes an alloy film made of an alloy containing Al atoms and at least any of Si atoms and Ti atoms. The contact electrode is annealed so as to establish ohmic connection between the silicon carbide substrate and the contact electrode.

According to the manufacturing method above, before annealing, the Al atoms contained in the contact electrode are present not as an element but as an alloy with at least any of Si atoms and Ti atoms. Thus, diffusion of the Al atoms to the outside of the contact electrode during annealing can be suppressed. Since diffusion of the Al atoms into the insulating film can thus be suppressed, insulation reliability of the insulating film can be enhanced.

Preferably, the alloy film is formed with sputtering using a target made of the alloy. Thus, production of a region where an Al element is present without being alloyed can be prevented.

Preferably, the alloy film contains Si atoms. More preferably, the alloy film contains Ti atoms. Thus, diffusion of Al atoms to the outside of the contact electrode during annealing can further reliably be suppressed.

Preferably, the insulating film includes at least any of a silicon oxide film and a silicon nitride film. The silicon oxide film is, for example, an $SiO_2$ film. The silicon nitride film is, for example, an SiN film.

The manufacturing method above may further have the step of forming a gate electrode on the insulating film. In this case, since the insulating film is used as a gate insulating film, current leakage between the gate electrode and the silicon carbide substrate can be suppressed.

The insulating film may be an interlayer insulating film. In this case, occurrence of current leakage within the interlayer insulating film can be suppressed.

As is clear from the description above, according to the present invention, in a case where a contact electrode having Al atoms is employed in a silicon carbide semiconductor device, insulation reliability of an insulating film can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
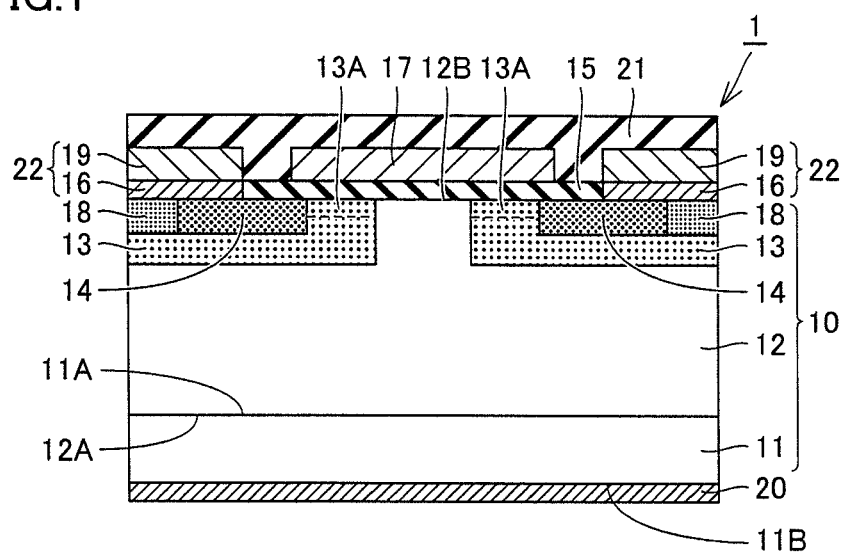
FIG. 1 is a schematic cross-sectional view showing a construction of a MOSFET (Metal Oxide Semiconductor Field Effect Transistor) in a first embodiment of the present invention.

An embodiment of the present invention will be described hereinafter with reference to the drawings. In the drawings below, the same or corresponding elements have the same reference characters allotted and description thereof will not be repeated.

First Embodiment

Initially, a construction of a MOSFET (Metal Oxide Semiconductor Field Effect Transistor) in the present embodiment will be described.

Referring to FIG. 1, a MOSFET 1 (a silicon carbide semiconductor device) has a silicon carbide substrate 10. Silicon carbide substrate 10 includes an $n^+$ substrate 11, an $n^-$ SiC layer 12, a p body 13, an $n^+$ source region 14, and a $p^+$ region 18.

$N^+$ substrate 11 is a substrate composed of silicon carbide (SiC) and having an n conductivity type. $N^+$ substrate 11 contains an n-type impurity (an impurity having the n conductivity type) such as N (nitrogen) at high concentration.

$N^-$ SiC layer 12 is a semiconductor layer composed of SiC and having the n conductivity type. $N^-$ SiC layer 12 is formed on one main surface 11A of $n^+$ substrate 11, for example, to a thickness of approximately 10 μm. Examples of n-type impurities contained in $n^-$ SiC layer 12 include N (nitrogen), and an impurity is contained at concentration lower than concentration of an n-type impurity contained in $n^+$ substrate 11, for example, at concentration of $5 \times 10^{15}$ cm$^{-3}$.

A pair of p bodies 13 has a p conductivity type. The pair of p bodies 13 is formed in $n^-$ SiC layer 12 such that the p bodies are separate from each other so as to include a second main surface 12B (a substrate surface) which is a main surface opposite to a first main surface 12A which is a main surface on the $n^+$ substrate 11 side. For example, Al (aluminum), B (boron), or the like is adopted as a p-type impurity to be contained in p body 13, and it is contained at concentration lower than concentration of the n-type impurity contained in $n^+$ substrate 11, for example, at concentration of $1 \times 10^{17}$ cm$^{-3}$.

$N^+$ source region 14 has the n conductivity type. $N^+$ source region 14 is formed within each p body 13 so as to include second main surface 12B and to be surrounded by p body 13. $N^+$ source region 14 contains an n-type impurity such as P (phosphorus) at concentration higher than concentration of the n-type impurity contained in $n^-$ SiC layer 12, for example, at concentration of $1 \times 10^{20}$ cm$^{-3}$.

$P^+$ region 18 has the p conductivity type. $P^+$ region 18 is formed to include second main surface 12B, on the side opposite to $n^+$ source region 14 formed within the other p body 13, when viewed from $n^+$ source region 14 formed within one p body 13 of the pair of p bodies 13. $P^+$ region 18 contains a p-type impurity such as Al or B at concentration higher than concentration of the p-type impurity contained in p body 13, for example, at concentration of $1 \times 10^{20}$ cm$^{-3}$.

Further, MOSFET 1 includes a gate oxide film 15 (an insulating film) serving as a gate insulating film, a gate electrode 17, a pair of source contact electrodes 16, a source interconnection 19, a drain electrode 20, and a passivation film 21.

Gate oxide film 15 is formed on second main surface 12B of $n^-$ SiC layer 12 so as to be in contact with second main surface 12B and to extend from an upper surface of one $n^+$ source region 14 to an upper surface of the other $n^+$ source region 14. Gate oxide film 15 preferably includes at least any of a silicon oxide film and a silicon nitride film, and it is composed, for example, of silicon dioxide ($SiO_2$).

Gate electrode 17 is arranged in contact with gate oxide film 15 so as to extend from one $n^+$ source region 14 to the other $n^+$ source region 14 over the same. In addition, gate electrode 17 is made of a conductor such as polysilicon, Al or the like.

Source contact electrode 16 is arranged in contact with second main surface 12B, so as to extend from a pair of $n^+$ source regions 14, in a direction away from gate oxide film 15, to $p^+$ region 18. Source contact electrode 16 contains titanium (Ti) atoms, aluminum (Al) atoms, silicon (Si) atoms, and carbon (C) atoms as well as a remaining inevitable impurity. Here, the inevitable impurity includes oxygen (O) atoms inevitably introduced during a manufacturing process. Source contact electrode 16 contains aluminum atoms and titanium atoms in a region including an interface with $n^-$ SiC layer 12 where source region 14 and $p^+$ region 18 are formed.

Source interconnection 19 is formed in contact with source contact electrode 16 and it is made of a conductor such as Al. Source interconnection 19 is electrically connected to $n^+$ source region 14 through source contact electrode 16. This source interconnection 19 and source contact electrode 16 constitute a source electrode 22.

Drain electrode 20 is formed in contact with the other main surface 11B of $n^+$ substrate 11, which is a main surface opposite to one main surface 11A which is a main surface on a side where $n^-$ SiC layer 12 is formed. For example, this drain electrode 20 may be constructed similarly to source contact electrode 16 above, or it may be made of another material capable of establishing ohmic contact with $n^+$ substrate 11, such as Ni. Thus, drain electrode 20 is electrically connected to $n^+$ substrate 11.

Passivation film 21 is formed to extend from one source interconnection 19 over gate electrode 17 to the other source interconnection 19. This passivation film 21 is composed, for example, of $SiO_2$ and it has a function to electrically isolate source interconnection 19 and gate electrode 17 from outside and to protect MOSFET 1.

In general, in many cases, Ni is adopted as a material for an electrode in contact with an n-type SiC region. Meanwhile, in a DMOS (Double-diffused MOSFET)-type vertical MOSFET including, for example, SiC as a material, a structure in which an electrode composed of Ni is in contact with both of a p-type SiC region and an n-type SiC region is adopted. This is because the DMOS-type vertical MOSFET requires an electrode in contact with both of the p-type region and the n-type region, while an electrode composed of Ni can be in contact also with the p-type SiC region at contact resistivity around $10^{-2}$ Ω·cm$^2$. Though this contact resistivity of $10^{-2}$ Ω·cm$^2$ indicates a numeric value allowing use as an ohmic contact electrode, it is not sufficiently low, taking into account the fact that an electrode composed of Ti/Al can be in contact with the p-type SiC region at contact resistivity around $10^{-3}$ Ω·cm$^2$.

On the other hand, in an example where an electrode composed of Ti/Al is adopted, though contact resistance with the p-type SiC region is sufficiently suppressed, contact resistivity with the n-type SiC region is around $10^{-3}$ Ω·cm$^2$. This contact resistivity of $10^{-3}$ $\Omega \cdot cm^2$ also indicates a numeric value allowing use as an ohmic contact electrode, however, contact resistance between the electrode composed of Ti/Al and the n-type SiC region is not sufficiently low, taking into account the fact that an electrode composed of Ni can be in contact with the n-type SiC region at contact resistivity around $10^{-6}$ $\Omega \cdot cm^2$.

In contrast, source contact electrode 16 is an ohmic contact electrode containing Ti atoms, Al atoms, and Si atoms, so that it is sufficiently low in contact resistance with any of a p-type SiC region and an n-type SiC region. In addition, source contact electrode 16 is arranged to extend from the region in contact with $n^+$ source region 14 to the region in contact with $p^+$ region 18. Consequently, MOSFET 1 is a semiconductor device capable of achieving decrease in the number of steps in a manufacturing process and improvement in integration.

More specifically, in MOSFET 1 in the present embodiment having a DMOS structure, it is necessary to hold $n^+$ source region 14 and p body 13 at the same potential. Therefore, source contact electrode 16 is required to electrically be connected to both of $n^+$ source region 14 and p body 13 with contact resistance being lowered. In addition, in MOSFET 1, in order to lower ON resistance, $n^+$ source region 14 and source contact electrode 16 should electrically be connected to each other with contact resistance being suppressed. In order to meet such requirements and to achieve decrease in the number of steps in a manufacturing process and improvement in integration, source contact electrode 16 extending from the region in contact with $n^+$ source region 14 to the region in contact with p body 13 with contact resistance being lowered is required. Source contact electrode 16 is in contact with both of $n^+$ source region 14 and $p^+$ region 18 (p body 13) at low contact resistance, by having the construction above. Consequently, MOSFET 1 is a semiconductor device capable of achieving decrease in the number of steps in a manufacturing process and improvement in integration while achieving higher efficiency.

An operation of MOSFET 1 will now be described. In such a state that a voltage not higher than a threshold value is applied to gate electrode 17, that is, in an OFF state, a portion between p body 13 located directly under gate oxide film 15 and $n^-$ SiC layer 12 is reverse-biased and in a non-conducting state. On the other hand, as a positively increasing voltage is applied to gate electrode 17, an inversion layer is formed in a channel region 13A, which is a region around a portion of contact of p body 13 with gate oxide film 15. Consequently, $n^+$ source region 14 and $n^-$ SiC layer 12 are electrically connected to each other and a current flows between source electrode 22 and drain electrode 20.

A method of manufacturing MOSFET 1 in the first embodiment will now be described.

Figure 2:
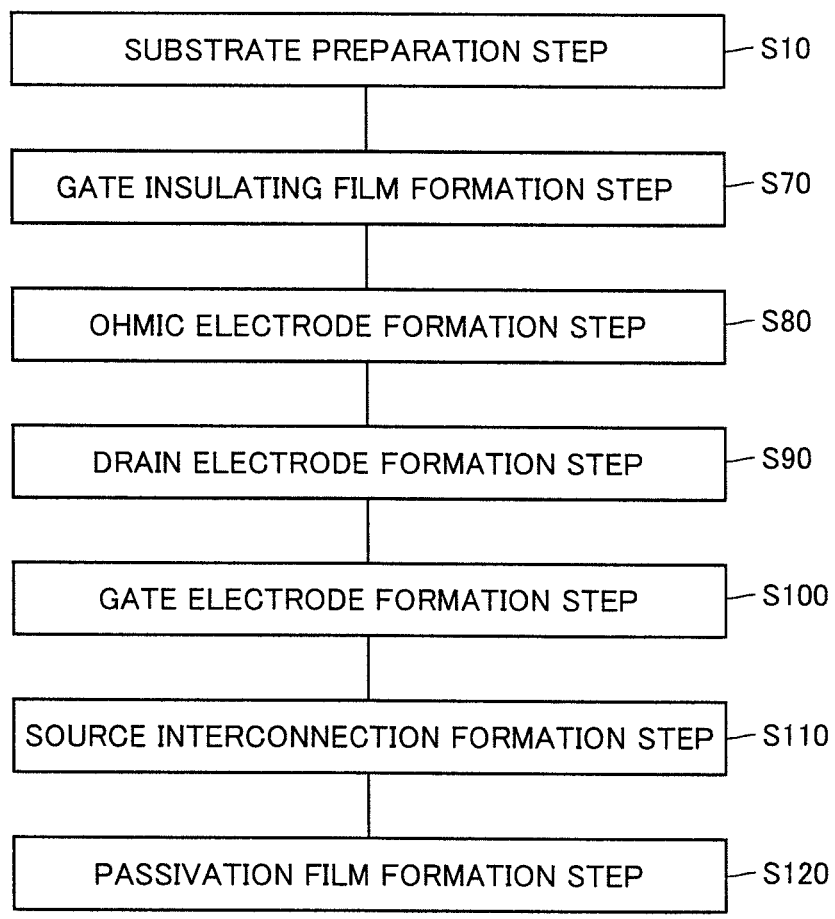
FIG. 2 is a flowchart showing outlines of a method of manufacturing a MOSFET in FIG. 1.
Figure 4:
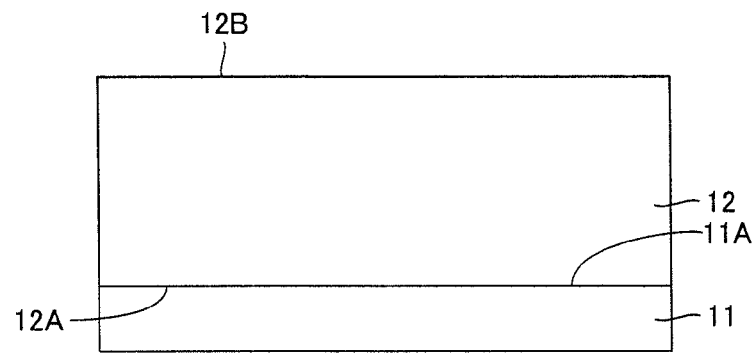
FIG. 4 is a schematic cross-sectional view showing a first step in the method of manufacturing a MOSFET in FIG. 1.
Figure 5:
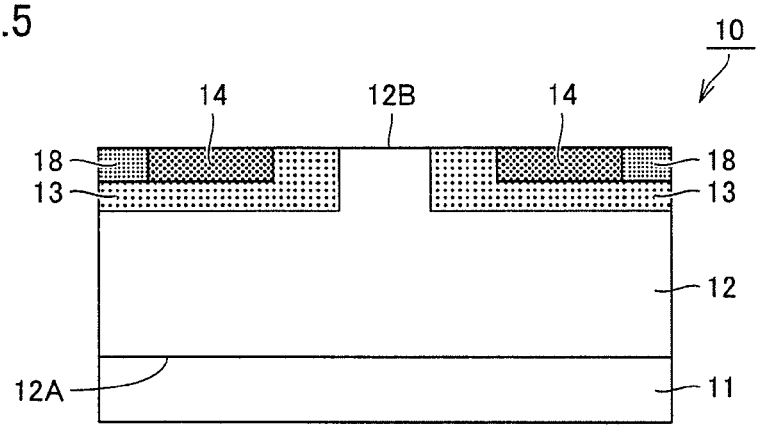
FIG. 5 is a schematic cross-sectional view showing a second step in the method of manufacturing a MOSFET in FIG. 1.

Referring to FIGS. 4 and 5, initially, in a substrate preparation step S10 (FIG. 2), silicon carbide substrate 10 is prepared.

Specifically, initially, $n^-$ SiC layer 12 is formed on one main surface 11A of $n^+$ SiC substrate 11 through epitaxial growth on $n^+$ SiC substrate 11. Epitaxial growth can be achieved, for example, by adopting a gas mixture of $SiH_4$ (silane) and $C_3H_8$ (propane) as a source gas. Here, for example, N is introduced as the n-type impurity. Thus, $n^-$ SiC layer 12 containing an n-type impurity at concentration lower than concentration of an n-type impurity contained in $n^+$ SiC substrate 11 can be formed.

Then, an oxide film composed of $SiO_2$ is formed on second main surface 12B, for example, with CVD (Chemical Vapor Deposition). Then, after a resist is applied onto the oxide film, exposure and development are performed to thereby form a resist film having an opening in a region in conformity with a desired shape of p body 13. Using this resist film as a mask, the oxide film is partially removed, for example, through RIE (Reactive Ion Etching), and a mask layer formed of the oxide film having an opening pattern is formed on $n^-$ SiC layer 12. Thereafter, the resist film above is removed. Then, using this mask layer as a mask, ion implantation of a p-type impurity such as Al in if SiC layer 12 is performed, to thereby form p body 13 in $n^-$ SiC layer 12. After the oxide film above used as the mask is removed, a mask layer having an opening in a region in conformity with a desired shape of $n^+$ source region 14 is formed. Using this mask layer as a mask, an n-type impurity such as P is introduced in $n^-$ SiC layer 12 through ion implantation, to thereby form $n^+$ source region 14. Then, a mask layer having an opening in a region in conformity with a desired shape of $p^+$ region 18 is formed, and using this mask layer as a mask, a p-type impurity such as Al or B is introduced in $n^-$ SiC layer 12 through ion implantation, to thereby form $p^+$ region 18.

Then, heat treatment for activating an impurity introduced through ion implantation above is performed. Specifically, $n^-$ SiC layer 12 in which ions have been implanted is heated to a temperature around 1700° C., for example, in an Ar (argon) atmosphere and held for approximately 30 minutes.

As described above, silicon carbide substrate 10 (FIG. 5) having second main surface 12B is prepared.

Figure 6:
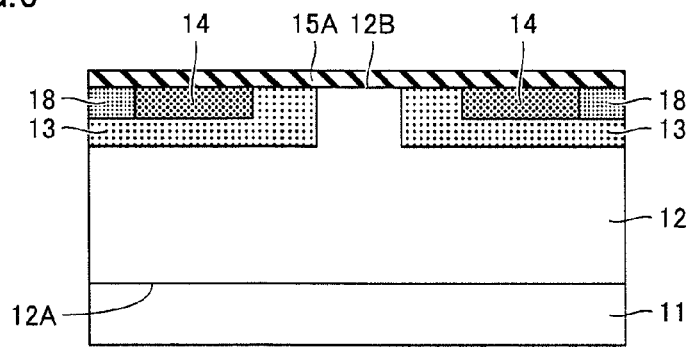
FIG. 6 is a schematic cross-sectional view showing a third step in the method of manufacturing a MOSFET in FIG. 1.
Figure 7:
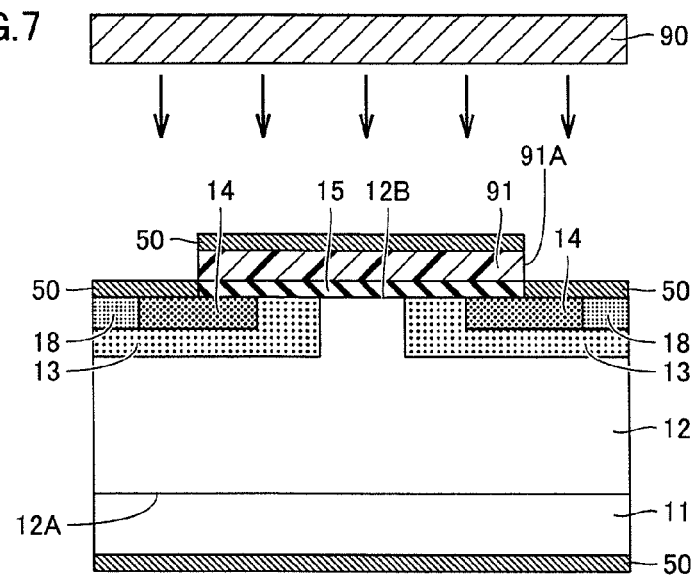
FIG. 7 is a schematic cross-sectional view showing a fourth step in the method of manufacturing a MOSFET in FIG. 1.

Referring to FIGS. 6 and 7, in a gate insulating film formation step S70 (FIG. 2), gate oxide film 15 (insulating film) is formed. Specifically, initially, the step above is performed to thermally oxidize $n^+$ substrate 11 on which $n^-$ SiC layer 12 including a desired ion implantation region has been formed. Thermal oxidation can be performed, for example, by heating the substrate to a temperature around 1300° C. in an oxygen atmosphere and holding the substrate for approximately 40 minutes. Thus, a thermal oxide film 15A composed of silicon dioxide ($SiO_2$) (for example, having a thickness of approximately 50 nm) is formed on second main surface 12B. After a resist is applied onto thermal oxide film 15A, exposure and development are performed to thereby form a resist film 91 having an opening 91A in conformity with a region where source contact electrode 16 (see FIG. 1) is to be formed. Then, using resist film 91 as a mask, thermal oxide film 15A is partially removed, for example, through RIE. Thus, gate oxide film 15 covering a part of second main surface 12B is formed.

Figure 8:
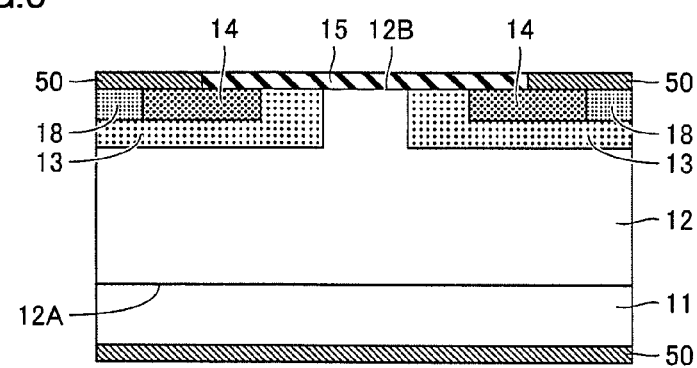
FIG. 8 is a schematic cross-sectional view showing a fifth step in the method of manufacturing a MOSFET in FIG. 1.
Figure 9:
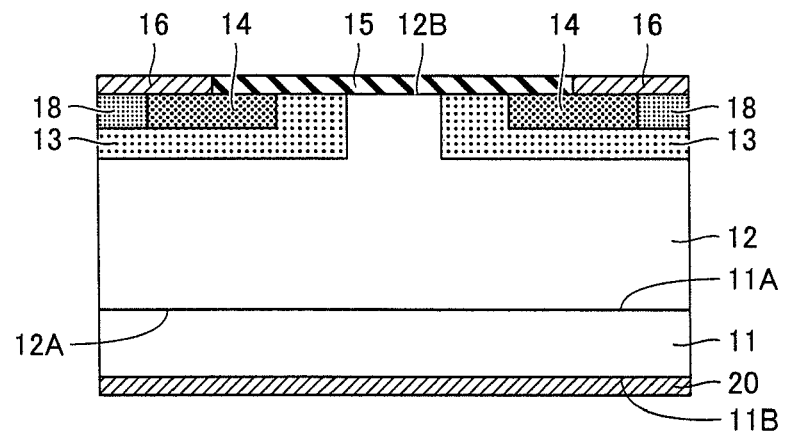
FIG. 9 is a schematic cross-sectional view showing a sixth step in the method of manufacturing a MOSFET in FIG. 1.

Referring to FIGS. 7 to 9, an ohmic electrode formation step S80 (FIG. 2) is performed.

Figure 3:
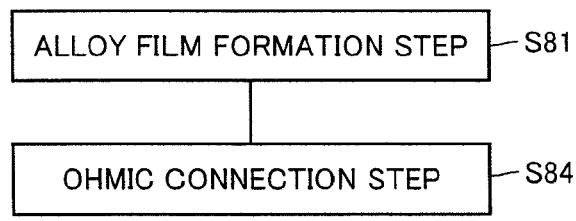
FIG. 3 is a flowchart showing an ohmic electrode formation step in FIG. 2.

Specifically, in an alloy film formation step S81 (FIG. 3), an alloy film 50 made of an alloy containing Si atoms, Ti atoms, and Al atoms is formed. Namely, alloy film 50 is formed on second main surface 12B and on the main surface of $n^+$ substrate 11 opposite to $n^-$ SiC layer 12. Preferably, the alloy film is formed with sputtering using a sputtering target 90. Sputtering target 90 is made of an alloy containing Al atoms, Si atoms, and Ti atoms. Then, as a result of removal of resist film 91, alloy film 50 on resist film 91 is removed (lifted off), so that alloy film 50 remains on second main surface 12B exposed through gate oxide film 15 and on the main surface of $n^+$ substrate 11 opposite to $n^-$ SiC layer 12, as shown in FIG. 8. Thus, source contact electrode 16 arranged in contact with second main surface 12B, extending from the pair of $n^+$ source regions 14 in a direction away from gate oxide film 15 to $p^+$ region 18 and drain electrode 20 arranged in contact with the other main surface 11B of $n^+$ substrate 11, which is the main surface opposite to one main surface 11A which is the main surface on the side where $n^-$ SiC layer 12 is formed, are formed. Source contact electrode 16 is formed on second main surface 12B, so as to be in contact with gate oxide film 15.

Then, in an ohmic connection step S84 (FIG. 3), electrical connection between alloy film 50 and silicon carbide substrate 10 is made ohmic through annealing. Specifically, annealing in which heating to a temperature not lower than 550° C. and not higher than 1200° C., preferably not lower than 900° C. and not higher than 1100° C., for example 1000° C., in an atmosphere of an inert gas such as Ar is carried out and holding for a time period not longer than 10 minutes, for example, 2 minutes, is carried out, is performed. Thus, Ti atoms, Al atoms, and Si atoms contained in alloy film 50 as well as Si atoms and C atoms contained in silicon carbide substrate 10 are alloyed. Here, n+ substrate 11 is preferably heated in a gas mixture of an inert gas, in particular, Ar and/or $N_2$, and hydrogen. Thus, source contact electrode 16 can be fabricated with manufacturing cost being suppressed and contact resistance with n+ source region 14 and p body 13 (p+ region 18) further reliably being suppressed.

Referring again to FIG. 1, in a gate electrode formation step S100 (FIG. 2), gate electrode 17 is formed. In this step, gate electrode 17 composed of a conductor such as polysilicon or Al is formed to be in contact with gate oxide film 15 and to extend from one n+ source region 14 to the other n+ source region 14 over the same. In an example where polysilicon is adopted as a material for a gate electrode, polysilicon can contain P at high concentration exceeding $1\times10^{20}$ cm$^{-3}$.

Then, in a source interconnection formation step S110 (FIG. 2), source interconnection 19 is formed. In this step, source interconnection 19 composed of a conductor such as Al is formed on the upper surface of source contact electrode 16, for example, with a vapor deposition method. Source electrode 22 is thus completed.

Then, in a passivation film formation step S120, passivation film 21 is formed. In this step, this passivation film 21 composed, for example, of $SiO_2$, is formed to extend from one source interconnection 19 over gate electrode 17 to the other source interconnection 19. This passivation film 21 can be formed, for example, with a CVD method.

MOSFET 1 is completed as above.

According to the manufacturing method in the present embodiment, before annealing of source contact electrode 16, Al atoms contained in source contact electrode 16 are present not as an element but as an alloy with Si atoms and Ti atoms. Thus, diffusion of Al atoms to the outside of source contact electrode 16 during annealing is suppressed. Since diffusion of Al atoms into gate oxide film 15 is suppressed, reliability of gate oxide film 15 can be enhanced.

In addition, alloy film 50 is formed with sputtering using sputtering target 90 made of an alloy. Thus, production of a region in a film to be formed, where Al element is present without being alloyed, can be suppressed.

It is noted that an insulating film made of other materials may be formed instead of thermal oxide film 15A in the step in FIG. 6, and for example, a silicon nitride film may be formed.

Second Embodiment

A construction of a JFET (junction field effect transistor) in the present embodiment will initially be described.

Figure 10:
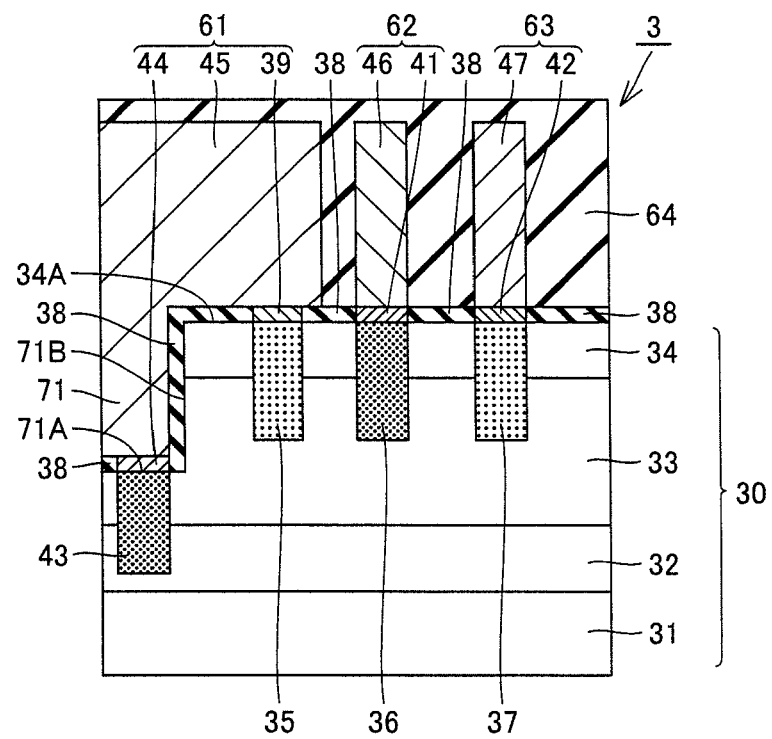
FIG. 10 is a schematic cross-sectional view showing a construction of a JFET (Junction Field Effect Transistor) in a second embodiment of the present invention.

Referring to FIG. 10, a JFET 3 (a silicon carbide semiconductor device) is similar in construction of an ohmic contact electrode to MOSFET 1 in the first embodiment above, and achieves similar effects. Specifically, JFET 3 has a silicon carbide substrate 30. Silicon carbide substrate 30 has an n-type substrate 31, a first p-type layer 32, an n-type layer 33, and a second p-type layer 34. N-type substrate 31 is composed of SiC and has the n conductivity type. First p-type layer 32 is formed on n-type substrate 31. N-type layer 33 is formed on first p-type layer 32. P-type layer 34 is formed on n-type layer 33. First p-type layer 32 can have a thickness of approximately 10 μm and concentration of a p-type impurity of approximately $7.5\times10^{15}$ cm$^{-3}$. For example, n-type layer 33 can have a thickness of approximately 0.45 μm and concentration of an n-type impurity of approximately $2\times10^{17}$ cm$^{-3}$. For example, second p-type layer 34 can have a thickness of approximately 0.25 μm and concentration of a p-type impurity of approximately $2\times10^{17}$ cm$^{-3}$.

In second p-type layer 34 and n-type layer 33, a first n-type region 35 and a second n-type region 37 containing an impurity having the n conductivity type (the n-type impurity) at concentration higher than in n-type layer 33 (for example, approximately $1\times10^{20}$ cm$^{-3}$) are formed, and a first p-type region 36 containing an impurity having the p conductivity type (the p-type impurity) at concentration higher than in first p-type layer 32 and second p-type layer 34 (for example, approximately $1\times10^{18}$ cm$^{-3}$) is formed such that it lies between first n-type region 35 and second n-type region 37. Namely, first n-type region 35, first p-type region 36 and second n-type region 37 are formed to reach n-type layer 33 through second p-type layer 34. In addition, a bottom portion of each of first n-type region 35, first p-type region 36 and second n-type region 37 is arranged at a distance from an upper surface of first p-type layer 32 (a boundary portion between first p-type layer 32 and n-type layer 33).

On the side opposite to first p-type region 36 when viewed from first n-type region 35, a groove portion 71 is formed to extend from an upper surface 34A of second p-type layer 34 (a main surface opposite to the n-type layer 33 side) through second p-type layer 34 to reach n-type layer 33. Namely, a bottom surface 71A of groove portion 71 is located inside n-type layer 33, at a distance from an interface between first p-type layer 32 and n-type layer 33. In addition, a second p-type region 43 containing a p-type impurity at concentration higher than in first p-type layer 32 and second p-type layer 34 (for example, approximately $1\times\times10^{18}$ cm$^{-3}$) is formed to extend from bottom surface 71A of groove portion 71 through n-type layer 33 to reach first p-type layer 32. A bottom portion of this second p-type region 43 is arranged at a distance from an upper surface of n-type substrate 31 (a boundary portion between n-type substrate 31 and first p-type layer 32).

In addition, a source contact electrode 39, a gate contact electrode 41, a drain contact electrode 42, and a potential-holding contact electrode 44 serving as ohmic contact electrodes are formed in contact with upper surfaces of first n-type region 35, first p-type region 36, second n-type region 37, and second p-type region 43, respectively. Source contact electrode 39, gate contact electrode 41, drain contact electrode 42, and potential-holding contact electrode 44 have features similar to that of source contact electrode 16 in the first embodiment.

An oxide film 38 (an insulating film) serving as an interlayer insulating film is formed between each of source contact electrode 39, gate contact electrode 41, drain contact electrode 42, and potential-holding contact electrode 44 serving as ohmic contact electrodes and adjacent another ohmic contact electrode. More specifically, oxide film 38 serving as an interlayer insulating film is formed on upper surface 34A of second p-type layer 34 and on bottom surface 71A and a sidewall 71B of groove portion 71, so as to cover the entire region other than regions where source contact electrode 39, gate contact electrode 41, drain contact electrode 42, and potential-holding contact electrode 44 are formed. Adjacent ohmic contact electrodes are thus isolated from each other.

Further, a source interconnection 45, a gate interconnection 46 and a drain interconnection 47 are formed to be in contact with the upper surfaces of source contact electrode 39, gate contact electrode 41 and drain contact electrode 42, respectively, and they are electrically connected to the ohmic contact electrodes. Source interconnection 45 is also in contact with an upper surface of potential-holding contact electrode 44, and hence it is also electrically connected to potential-holding contact electrode 44. Namely, source interconnection 45 is formed to extend from the upper surface of source contact electrode 39 to the upper surface of potential-holding contact electrode 44, and thus potential-holding contact electrode 44 is held at a potential as high as source contact electrode 39. Source interconnection 45, gate interconnection 46 and drain interconnection 47 are made of a conductor such as Al. Source contact electrode 39 and source interconnection 45 constitute a source electrode 61, gate contact electrode 41 and gate interconnection 46 constitute a gate electrode 62, and drain contact electrode 42 and drain interconnection 47 constitute a drain electrode 63. Furthermore, a passivation film 64 is formed to cover upper surfaces of source electrode 61, gate electrode 62, drain electrode 63, and oxide film 38. This passivation film 64 is made, for example, of $SiO_2$, and it has a function to electrically isolate source electrode 61, gate electrode 62 and drain electrode 63 from the outside and to protect JFET 3.

Namely, JFET 3 includes silicon carbide substrate 30, as well as source contact electrode 39, gate contact electrode 41, drain contact electrode 42, and potential-holding contact electrode 44 serving as ohmic contact electrodes, that are arranged in contact with silicon carbide substrate 30 and contain Ti, Al, Si, and C as well as a remaining inevitable impurity. Silicon carbide substrate 30 includes first n-type region 35 and second n-type region 37 having the n conductivity type and first p-type region 36 and second p-type region 43 having the p conductivity type. In addition, source contact electrode 39 and drain contact electrode 42 among the ohmic contact electrodes above are in contact with first n-type region 35 and second n-type region 37 respectively, and gate contact electrode 41 and potential-holding contact electrode 44 are in contact with first p-type region 36 and second p-type region 43 respectively. Source contact electrode 39, gate contact electrode 41, drain contact electrode 42, and potential-holding contact electrode 44 have features similar to that of source contact electrode 16 in the first embodiment.

In JFET 3, source contact electrode 39 and drain contact electrode 42 having features similar to that of source contact electrode 16 in the first embodiment are in contact with first n-type region 35 and second n-type region 37 each of which is an n-type region, and gate contact electrode 41 made of a material the same as that for source contact electrode 39 and drain contact electrode 42 is arranged in contact with first p-type region 36 and second p-type region 43 each of which is a p-type region. Thus, JFET 3 is a semiconductor device capable of achieving decrease in the number of steps in a manufacturing process and improvement in integration.

If it is assumed that Ni is used as a material for forming source contact electrode 39 and drain contact electrode 42 arranged in contact with first n-type region 35 and second n-type region 37 respectively and Ti/Al is used as a material for forming gate contact electrode 41 arranged in contact with first p-type region 36, the following problem arises. Namely, under this assumption, after a mask for forming source contact electrode 39 and drain contact electrode 42 is formed, these electrodes are formed with vapor deposition or the like. Thereafter, after the mask is removed, it is necessary to further form a mask for forming gate contact electrode 41 and to form this electrode with vapor deposition or the like. If such a manufacturing process is adopted, the number of steps increases and improvement in integration is interfered because of registration error in forming masks twice. In contrast, in JFET 3 in the present embodiment, since source contact electrode 39, gate contact electrode 41 and drain contact electrode 42 can be formed with the same material, these electrodes can collectively be formed by forming a mask once. Consequently, JFET 3 in the present embodiment can achieve decrease in the number of steps in a manufacturing process and improvement in integration.

An operation of JFET 3 will now be described. Referring to FIG. 10, while a voltage of gate electrode 62 is set to 0 V, a region lying between first p-type region 36 and second n-type region 37 and a region lying between the former region and first p-type layer 32 (a drift region) in n-type layer 33 as well as a region lying between first p-type region 36 and first p-type layer 32 (a channel region) are not depleted, and hence first n-type region 35 and second n-type region 37 are electrically connected to each other through n-type layer 33. Therefore, electrons migrate from first n-type region 35 toward second n-type region 37, whereby a current flows.

Meanwhile, as a voltage increasing in a negative direction is applied to gate contact electrode 41, depletion of the channel region and the drift region described above proceeds and first n-type region 35 and second n-type region 37 are electrically disconnected from each other. Therefore, electrons cannot migrate from first n-type region 35 toward second n-type region 37, whereby no current flows.

A method of manufacturing JFET 3 in the second embodiment will now be described.

Figure 11:
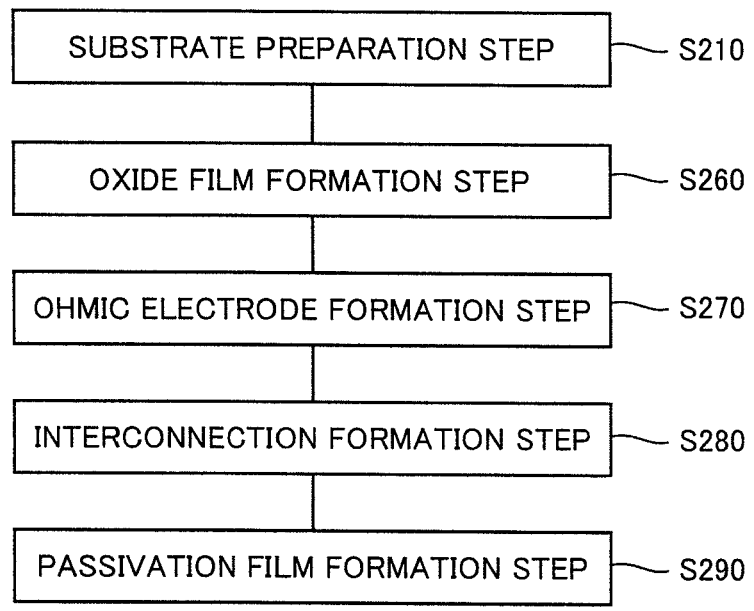
FIG. 11 is a flowchart showing outlines of a method of manufacturing a JFET in FIG. 10.
Figure 12:
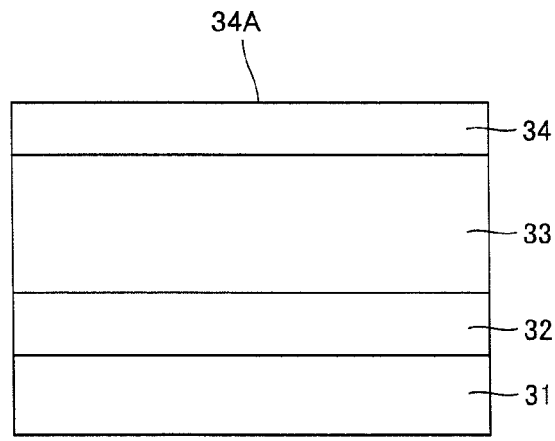
FIG. 12 is a schematic cross-sectional view showing a first step in the method of manufacturing a JFET in FIG. 10.
Figure 13:
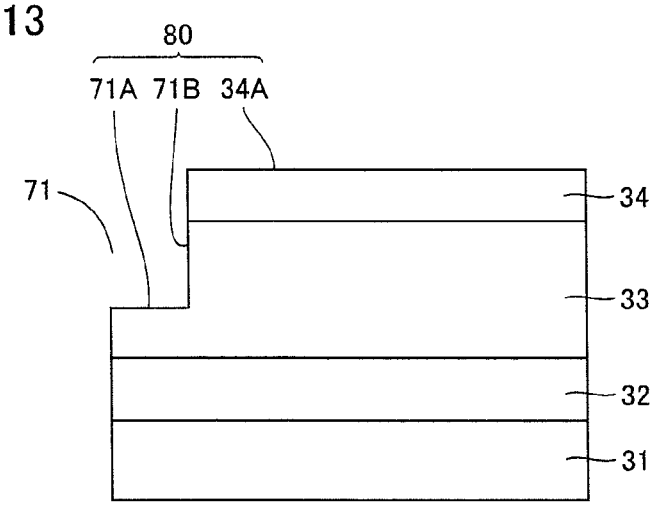
FIG. 13 is a schematic cross-sectional view showing a second step in the method of manufacturing a JFET in FIG. 10.
Figure 14:
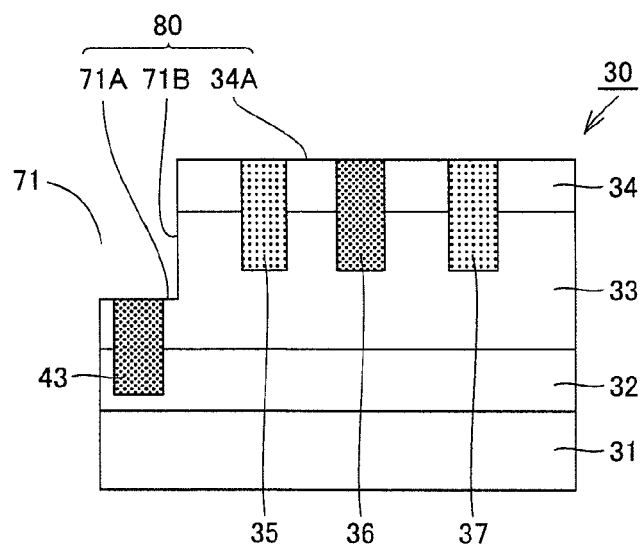
FIG. 14 is a schematic cross-sectional view showing a third step in the method of manufacturing a JFET in FIG. 10.

Referring to FIGS. 12 to 14, initially, in a substrate preparation step S210 (FIG. 11), silicon carbide substrate 30 is prepared.

Specifically, initially, first p-type layer 32, n-type layer 33 and second p-type layer 34 composed of SiC are successively formed on one main surface of n-type substrate 31. In this formation, for example, vapor-phase epitaxial growth is employed. In vapor-phase epitaxial growth, for example, a silane ($SiH_4$) gas and a propane ($C_3H_8$) gas can be used as a source gas, and a hydrogen ($H_2$) gas can be adopted as a carrier gas. In addition, for example, diborane ($B_2H_6$) or trimethylaluminum (TMA) can be adopted as a p-type impurity source for forming a p-type layer, and for example, nitrogen ($N_2$) can be adopted as an n-type impurity for forming an n-type layer. Thus, first p-type layer 32 and second p-type layer 34 containing a p-type impurity such as Al or B and n-type layer 33 containing an n-type impurity such as N are formed.

Then, groove portion 71 is formed to extend from upper surface 34A of second p-type layer 34 through second p-type layer 34 to reach n-type layer 33. Groove portion 71 has bottom surface 71A and sidewall 71B. Groove portion 71 is formed in such a manner that, for example, a mask layer having an opening at a desired position where groove portion 71 is to be formed is formed on upper surface 34A of second p-type layer 34 and thereafter dry etching using an $SF_6$ gas is performed.

Then, ion implantation is carried out. Specifically, initially, an oxide film composed of $SiO_2$ is formed on upper surface 34A of second p-type layer 34 and on the bottom surface of groove portion 71, for example, with CVD. Then, after a resist is applied onto the oxide film, exposure and development are performed to thereby form a resist film having openings in regions in conformity with desired shapes of first n-type region 35 and second n-type region 37. Then, using the resist film as a mask, the oxide film is partially removed, for example, through RIE, and a mask layer having an opening pattern and formed of the oxide film is formed on upper surface 34A of second p-type layer 34. Thereafter, the resist film above is removed, and using this mask layer as a mask, ion implantation in n-type layer 33 and second p-type layer 34 is performed. A type of ions to be implanted includes, for example, P, N and the like. First n-type region 35 and second n-type region 37 reaching n-type layer 33 through second p-type layer 34 are thus formed.

In addition, after the mask layer used for forming first n-type region 35 and second n-type region 37 is removed, in accordance with a similar procedure, a mask layer having openings in regions in conformity with desired shapes of first p-type region 36 and second p-type region 43 is formed on upper surface 34A of second p-type layer 34 and on bottom surface 71A of groove portion 71. Then, using this mask layer as a mask, ion implantation in first p-type layer 32, n-type layer 33 and second p-type layer 34 is performed. A type of ions to be implanted includes, for example, Al, B and the like. First p-type region 36 reaching n-type layer 33 through second p-type layer 34 and second p-type region 43 reaching first p-type layer 32 through n-type layer 33 from bottom surface 71A of groove portion 71 are thus formed.

Then, heat treatment for activating an impurity is performed. Specifically, n-type substrate 31 having first p-type layer 32, n-type layer 33 and second p-type layer 34 in which ion implantation above has been completed is heated to 1700° C. in an atmosphere of an inert gas such as argon and held for 30 minutes. Thus, an impurity is activated and it can function as the n-type impurity or the p-type impurity.

As described above, silicon carbide substrate 30 (FIG. 14) having a substrate surface 80 having upper surface 34A, bottom surface 71A, and sidewall 71B is prepared.

Figure 15:
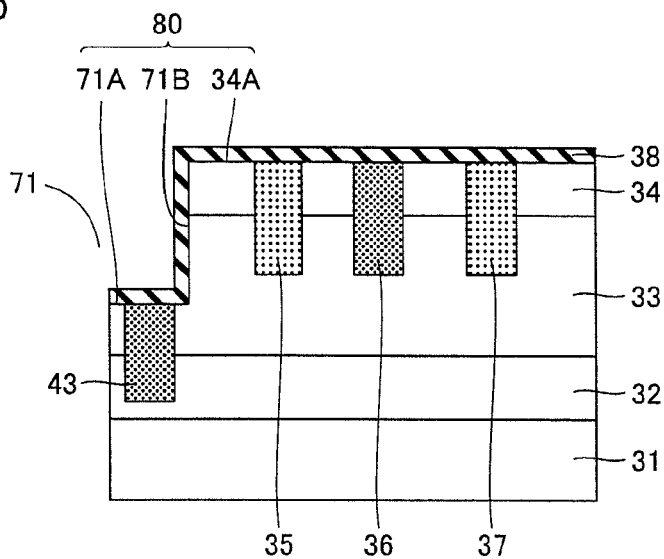
FIG. 15 is a schematic cross-sectional view showing a fourth step in the method of manufacturing a JFET in FIG. 10.
Figure 16:
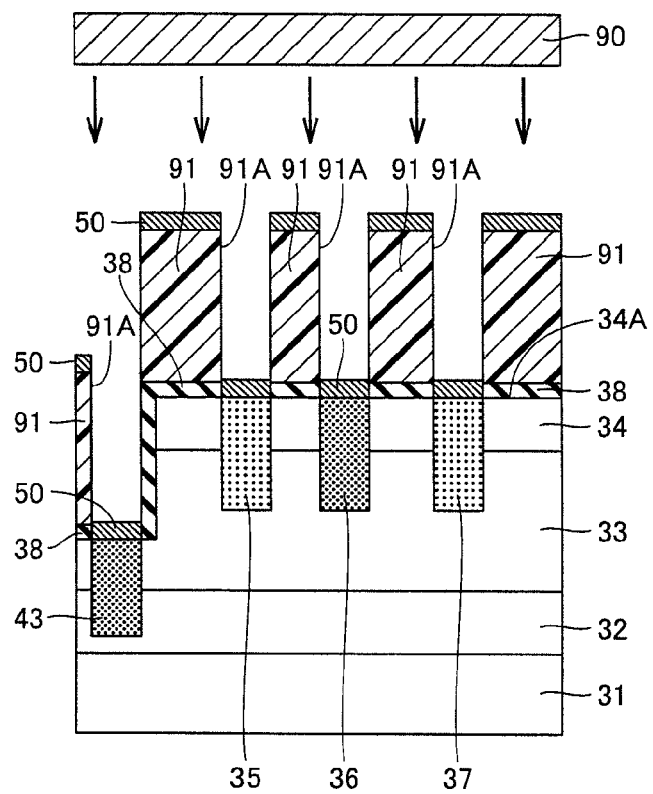
FIG. 16 is a schematic cross-sectional view showing a fifth step in the method of manufacturing a JFET in FIG. 10.

Referring to FIGS. 15 and 16, in an oxide film formation step S260 (FIG. 11), oxide film 38 is formed.

Specifically, initially, thermal oxidation treatment, for example, in which heating to a temperature around 1300° C. in an oxygen atmosphere and holding for approximately 90 minutes is carried out, is performed so that oxide film 38 serving as an insulating film (a field oxide film) covering upper surface 34A of second p-type layer 34 as well as bottom surface 71A and sidewall 71B of groove portion 71 is formed. Oxide film 38 has a thickness, for example, of approximately 0.1 μm.

Then, after a resist is applied onto oxide film 38, exposure and development are performed to thereby form resist film 91 having opening 91A in conformity with regions where source contact electrode 39, gate contact electrode 41, drain contact electrode 42, and potential-holding contact electrode 44 (see FIG. 10) are to be formed. Then, using resist film 91 as a mask, oxide film 38 is partially removed, for example, through RIE.

As described above, oxide film 38 (FIG. 16) covering a part of substrate surface 80 (FIG. 15) is formed.

Then, an ohmic electrode formation step S270 (FIG. 11) is performed. This step (S270) can be performed similarly to the step (S80) in the first embodiment. Specifically, initially, as in step S81 (FIG. 3) in the first embodiment, alloy film 50 is formed on resist film 91 and in a region exposed through resist film 91. Further, as a result of removal of resist film 91, alloy film 50 on resist film 91 is removed (lifted off), so that alloy film 50 remains in contact with first n-type region 35, first p-type region 36, second n-type region 37, and second p-type region 43.

Figure 17:
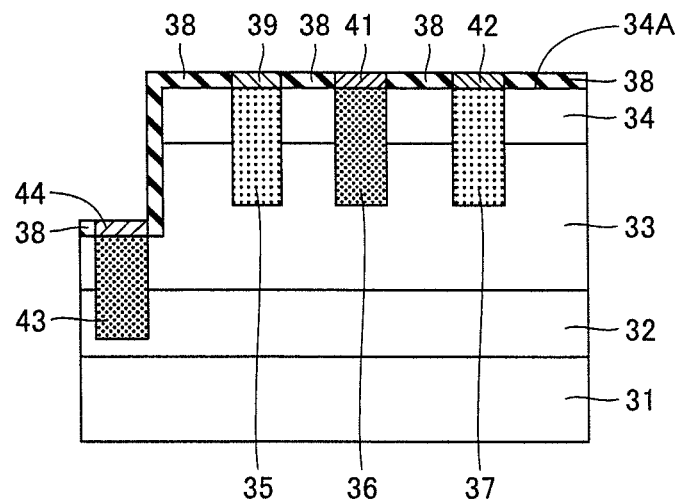
FIG. 17 is a schematic cross-sectional view showing a sixth step in the method of manufacturing a JFET in FIG. 10.

Referring further to FIG. 17, as in ohmic connection step S84 (FIG. 3) in the first embodiment, electrical connection between alloy film 50 and silicon carbide substrate 10 is made ohmic through annealing. Specifically, annealing in which heating to a temperature not lower than 550° C. and not higher than 1200° C., preferably not lower than 900° C. and not higher than 1100° C., for example 1000° C., in an atmosphere of an inert gas such as Ar is carried out and holding for a time period not longer than 10 minutes, for example, 2 minutes, is carried out, is performed. Thus, Ti atoms, Al atoms, and Si atoms contained in alloy film 50 as well as Si atoms and C atoms contained in n-type layer 33 or second p-type layer 34 are alloyed. Consequently, source contact electrode 39, gate contact electrode 41, drain contact electrode 42, and potential-holding contact electrode 44 serving as the ohmic contact electrodes are formed in contact with the upper surfaces of first n-type region 35, first p-type region 36, second n-type region 37, and second p-type region 43 respectively. Here, annealing above is preferably performed in a gas mixture of an inert gas, in particular, Ar and/or $N_2$, and hydrogen. Thus, source contact electrode 39, gate contact electrode 41, and drain contact electrode 42 can be fabricated with manufacturing cost being suppressed and contact resistance being suppressed.

Referring again to FIG. 10, an interconnection formation step S280 (FIG. 11) is performed. Specifically, source interconnection 45, gate interconnection 46 and drain interconnection 47 in contact with the upper surfaces of source contact electrode 39, gate contact electrode 41 and drain contact electrode 42 respectively are formed. Source interconnection 45, gate interconnection 46 and drain interconnection 47 can be formed, for example, by forming a resist layer having openings in desired regions where source interconnection 45, gate interconnection 46 and drain interconnection 47 are to be formed, vapor-depositing Al, and thereafter removing (lifting off) Al on the resist layer together with the resist layer.

Then, a passivation film formation step S290 (FIG. 11) is performed. Specifically, passivation film 64 composed, for example, of $SiO_2$ is formed to cover the upper surfaces of source electrode 61, gate electrode 62, drain electrode 63, and oxide film 38. This passivation film 64 can be formed, for example, with CVD.

As described above, JFET 3 is completed. Here, in the method of manufacturing JFET 3 representing a semiconductor device in the present embodiment above, since source contact electrode 39, gate contact electrode 41 and drain contact electrode 42 can be formed with the same material, these electrodes can simultaneously be formed by forming a mask once.

According to the manufacturing method in the present embodiment, Al atoms contained in each of source contact electrode 39, gate contact electrode 41, and drain contact electrode 42 are present not as an element but as an alloy with Si atoms and Ti atoms, before these electrodes are annealed. Thus, diffusion of Al atoms to the outside of these electrodes during annealing is suppressed. Therefore, since diffusion of Al atoms into oxide film 38 is suppressed, reliability of oxide film 38 can be enhanced.

It is noted that an insulating film made of other materials may be formed instead of oxide film 38 in the step in FIG. 15, and for example, a silicon nitride film may be formed.

Third Embodiment

In the present embodiment as well, MOSFET 1 substantially the same as in the first embodiment is manufactured.

Initially, as in the first embodiment, in gate insulating film formation step S70 (FIG. 2), gate oxide film 15 (insulating film) is formed.

Figure 18:
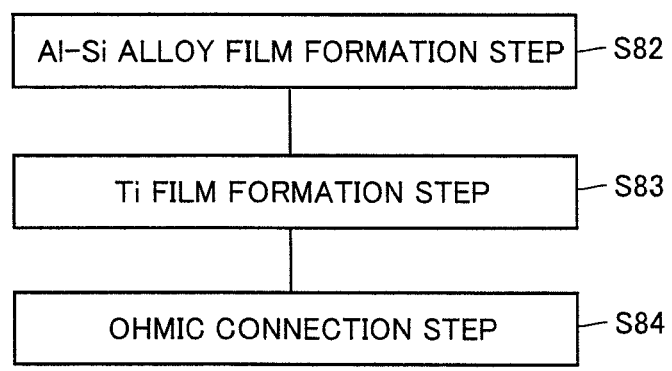
FIG. 18 is a flowchart showing an ohmic electrode formation step in a method of manufacturing a MOSFET in a third embodiment of the present invention.
Figure 19:
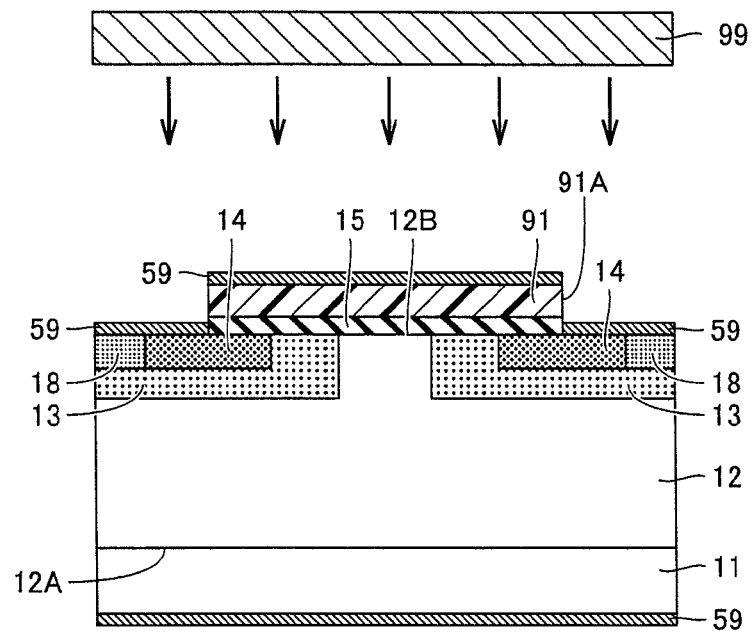
FIG. 19 is a schematic cross-sectional view showing a first step in the method of manufacturing a MOSFET in the third embodiment of the present invention.

Referring to FIG. 19, in an Al—Si alloy film formation step S82 (FIG. 18), an alloy film 59 made of an alloy containing Al atoms and Si atoms is formed. Namely, alloy film 59 is formed on second main surface 12B and on the main surface of n⁺ substrate 11 opposite to n⁻ SiC layer 12. Preferably, the alloy film is formed with sputtering using a sputtering target 99. Sputtering target 99 is made of an alloy containing Al atoms and Si atoms.

Figure 20:
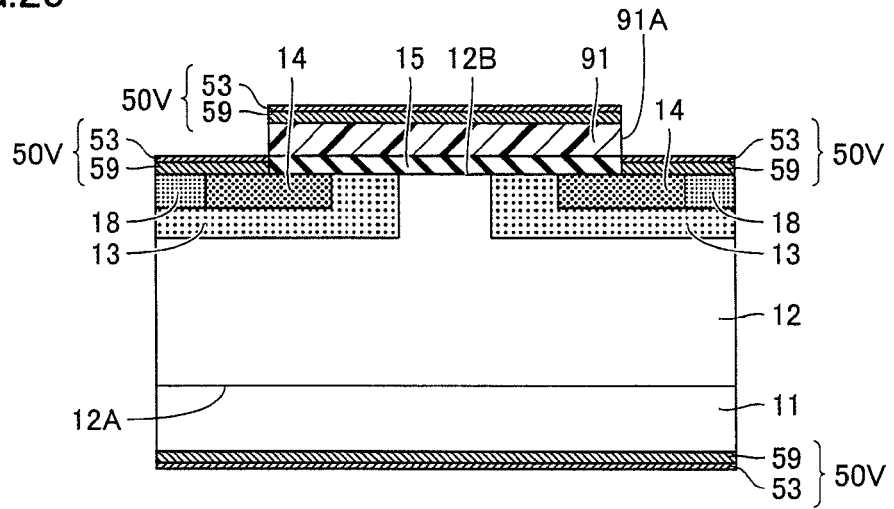
FIG. 20 is a schematic cross-sectional view showing a second step in the method of manufacturing a MOSFET in the third embodiment of the present invention.

Referring to FIG. 20, then, in a Ti film formation step S83 (FIG. 18), a Ti film 53 is formed on alloy film 59. Thus, a stack film 50V having alloy film 59 and Ti film 53 is formed.

Figure 21:
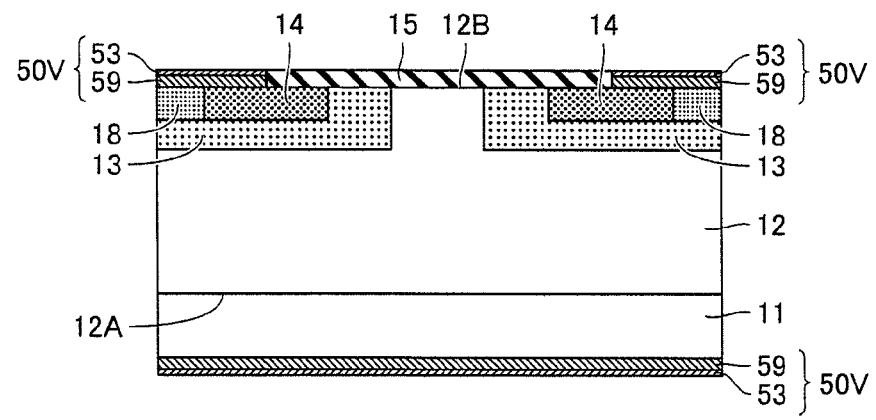
FIG. 21 is a schematic cross-sectional view showing a third step in the method of manufacturing a MOSFET in the third embodiment of the present invention.

Referring further to FIG. 21, then, as a result of removal of resist film 91, stack film 50V on resist film 91 is removed (lifted off), so that stack film 50V remains on second main surface 12B exposed through gate oxide film 15 and on the main surface of n⁺ substrate 11 opposite to n⁻ SiC layer 12. Thus, source contact electrode 16 arranged in contact with second main surface 12B, extending from the pair of n⁺ source regions 14 in a direction away from gate oxide film 15 to p⁺ region 18 and drain electrode 20 arranged in contact with the other main surface 11B of n⁺ substrate 11, which is the main surface opposite to one main surface 11A which is the main surface on the side where n⁻ SiC layer 12 is formed, are formed. Source contact electrode 16 is formed on second main surface 12B so as to be in contact with gate oxide film 15.

Then, in ohmic connection step S84 (FIG. 18), electrical connection between stack film 50V and silicon carbide substrate 10 is made ohmic through annealing. Specifically, annealing in which heating to a temperature not lower than 550° C. and not higher than 1200° C., preferably not lower than 900° C. and not higher than 1100° C., for example 1000° C., in an atmosphere of an inert gas such as Ar is carried out and holding for a time period not longer than 10 minutes, for example, 2 minutes, is carried out, is performed. Thus, Ti atoms, Al atoms, and Si atoms contained in stack film 50V as well as Si atoms and C atoms contained in silicon carbide substrate 10 are alloyed. Here, n⁺ substrate 11 is preferably heated in a gas mixture of an inert gas, in particular, Ar and/or N₂, and hydrogen. Thus, source contact electrode 16 can be fabricated with manufacturing cost being suppressed and contact resistance with n⁺ source region 14 and p body 13 (p⁺ region 18) further reliably being suppressed.

According to the present embodiment as well, an effect substantially the same as in the first embodiment is obtained.

In addition, according to the present embodiment, as Ti film 53 covers alloy film 59, oxidation of Al atoms in alloy film 59 can be prevented. The effect above can thus further be enhanced.

It is noted that an Al—Ti alloy film and an Si film may be employed instead of Al—Si alloy film 59 and Ti film 53, respectively.

Fourth Embodiment

In the present embodiment as well, JFET 3 substantially the same as in the second embodiment (FIG. 10) is manufactured.

Figure 22:
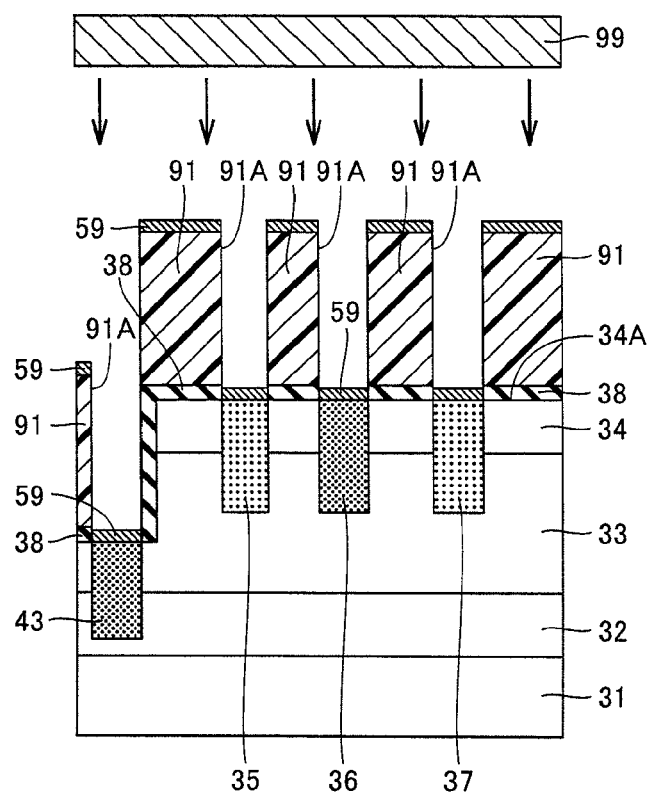
FIG. 22 is a schematic cross-sectional view showing a first step in a method of manufacturing a JFET in a fourth embodiment of the present invention.

Referring to FIG. 22, initially, as in the second embodiment, in oxide film formation step S260 (FIG. 11), oxide film 38 is formed. Then, alloy film 59 is formed with sputtering using sputtering target 99 as in the third embodiment.

Figure 23:
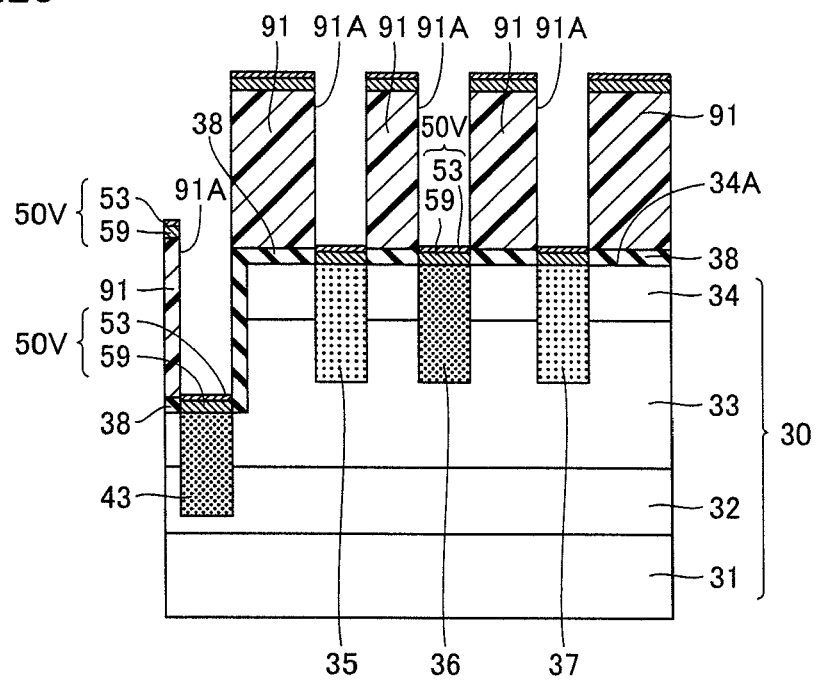
FIG. 23 is a schematic cross-sectional view showing a second step in the method of manufacturing a JFET in the fourth embodiment of the present invention.

Referring to FIG. 23, as in the third embodiment, Ti film 53 is formed on alloy film 59, so that stack film 50V having alloy film 59 and Ti film 53 is formed. Then, as a result of removal of resist film 91, stack film 50V on resist film 91 is removed (lifted off) so that stack film 50V remains in contact with first n-type region 35, first p-type region 36, second n-type region 37, and second p-type region 43.

Then, electrical connection between stack film 50V and silicon carbide substrate 30 is made ohmic through annealing. Specifically, annealing in which heating to a temperature not lower than 550° C. and not higher than 1200° C., preferably not lower than 900° C. and not higher than 1100° C., for example 1000° C., in an atmosphere of an inert gas such as Ar is carried out and holding for a time period not longer than 10 minutes, for example, 2 minutes, is carried out, is performed. Thus, Ti atoms, Al atoms, and Si atoms contained in stack film 50V as well as Si atoms and C atoms contained in silicon carbide substrate 30 are alloyed. Here, annealing above is preferably performed in a gas mixture of an inert gas, in particular, Ar and/or N₂, and hydrogen. Thus, source contact electrode 39, gate contact electrode 41, and drain contact electrode 42 (FIG. 10) can be fabricated with manufacturing cost being suppressed and contact resistance being suppressed.

Thereafter, through the steps as in the second embodiment, JFET 3 is completed.

According to the present embodiment as well, an effect substantially the same as in the second embodiment is obtained.

Further, according to the present embodiment, as Ti film 53 covers alloy film 59, oxidation of Al atoms in alloy film 59 can be prevented. The effect above can thus further be enhanced.

It is noted that an Al—Ti alloy film and an Si film may be employed instead of Al—Si alloy film 59 and Ti film 53, respectively.

It is noted that a construction in which n-type and p-type are interchanged in each embodiment above can also be employed. In addition, though a MOSFET and a JFET have been described above by way of example of a semiconductor device according to the present invention, other semiconductor devices such as an IGBT (Insulated Gate Bipolar Transistor) and a bipolar transistor may be manufactured.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method of manufacturing a silicon carbide semiconductor device, comprising the steps of:
    preparing a silicon carbide substrate having a substrate surface;
    forming an insulating film so as to cover a part of said substrate surface;
    forming a contact electrode on said substrate surface, so as to be in contact with said insulating film, said contact electrode containing Al, Ti, and Si atoms, said step of forming a contact electrode including the steps of forming an alloy film made of an alloy containing Al atoms and one of Si atoms or Ti atoms and forming a film of the other of Si atoms or Ti atoms on said alloy film; and
    annealing said contact electrode so as to establish ohmic connection between said silicon carbide substrate and said contact electrode.

2. The method of manufacturing a silicon carbide semiconductor device according to claim 1, wherein
    said alloy film is formed with sputtering using a target made of said alloy.

3. The method of manufacturing a silicon carbide semiconductor device according to claim 1, wherein
said alloy film contains Si atoms.

4. The method of manufacturing a silicon carbide semiconductor device according to claim 3, wherein
said alloy film contains Ti atoms.

5. The method of manufacturing a silicon carbide semiconductor device according to claim 1, wherein
said insulating film includes at least any of a silicon oxide film and a silicon nitride film.

6. The method of manufacturing a silicon carbide semiconductor device according to claim 1, further comprising the step of forming a gate electrode on said insulating film.

7. The method of manufacturing a silicon carbide semiconductor device according to claim 1, wherein
said insulating film is an interlayer insulating film.

* * * * *